US008822923B2

(12) United States Patent
Scheid et al.

(10) Patent No.: US 8,822,923 B2
(45) Date of Patent: Sep. 2, 2014

(54) SENSOR HEAD FOR AN X-RAY DETECTOR, X-RAY DETECTOR WITH SENSOR HEAD AND SENSOR ARRANGEMENT

(75) Inventors: Oliver Scheid, Poing (DE); Andreas Pahlke, Munich (DE)

(73) Assignee: Ketek GmbH, Munich (DE)

( * ) Notice: Subject to any disclaimer, the term of this patent is extended or adjusted under 35 U.S.C. 154(b) by 0 days.

(21) Appl. No.: 13/407,533

(22) Filed: Feb. 28, 2012

(65) Prior Publication Data
US 2012/0228498 A1 Sep. 13, 2012

(30) Foreign Application Priority Data
Mar. 3, 2011 (DE) .......................... 10 2011 012 989

(51) Int. Cl.
*G01T 1/00* (2006.01)
*H01L 25/00* (2006.01)
(52) U.S. Cl.
CPC .. *G01T 1/00* (2013.01); *H01L 25/00* (2013.01)
USPC ..................................................... 250/336.1
(58) Field of Classification Search
USPC ...................................................... 250/336.1
See application file for complete search history.

(56) References Cited

U.S. PATENT DOCUMENTS

| 5,043,582 A | * | 8/1991 | Cox et al. ................. 250/370.09 |
| 6,510,195 B1 | * | 1/2003 | Chappo et al. ................... 378/19 |
| 2005/0139757 A1 | * | 6/2005 | Iwanczyk et al. ............. 250/239 |
| 2007/0085088 A1 | * | 4/2007 | Sekine et al. .................... 257/80 |
| 2010/0133442 A1 | | 6/2010 | Hansen et al. |
| 2011/0139987 A1 | * | 6/2011 | Kromer ....................... 250/336.1 |
| 2012/0133001 A1 | * | 5/2012 | Tkaczyk et al. .............. 257/414 |
| 2012/0133054 A1 | * | 5/2012 | Tkaczyk et al. .............. 257/777 |

FOREIGN PATENT DOCUMENTS

| DE | 10 2005 037 860 A1 | 2/2007 | |
| WO | WO2009150080 | * 12/2009 | ............... G01T 1/24 |

* cited by examiner

*Primary Examiner* — David Porta
*Assistant Examiner* — Edwin Gunberg
(74) *Attorney, Agent, or Firm* — Slater & Matsil, L.L.P.

(57) ABSTRACT

A sensor head for an X-ray detector is specified. The sensor head includes a first conductor carrier having a frontal face, and a sensor element sensitive to X-ray radiation. The sensor element is arranged on the frontal face of the first conductor carrier, is electrically conductively connected to conductors of the first conductor carrier and has a detection area. Furthermore, the sensor head includes contact elements electrically conductively connected to the sensor element via the first conductor carrier and bonding wires that electrically conductively connect the first conductor carrier to the contact elements. The sensor element is electrically conductively connected to the contact elements. In a plan view of the detection area, the detection area at least partly covers the bonding wires.

22 Claims, 12 Drawing Sheets

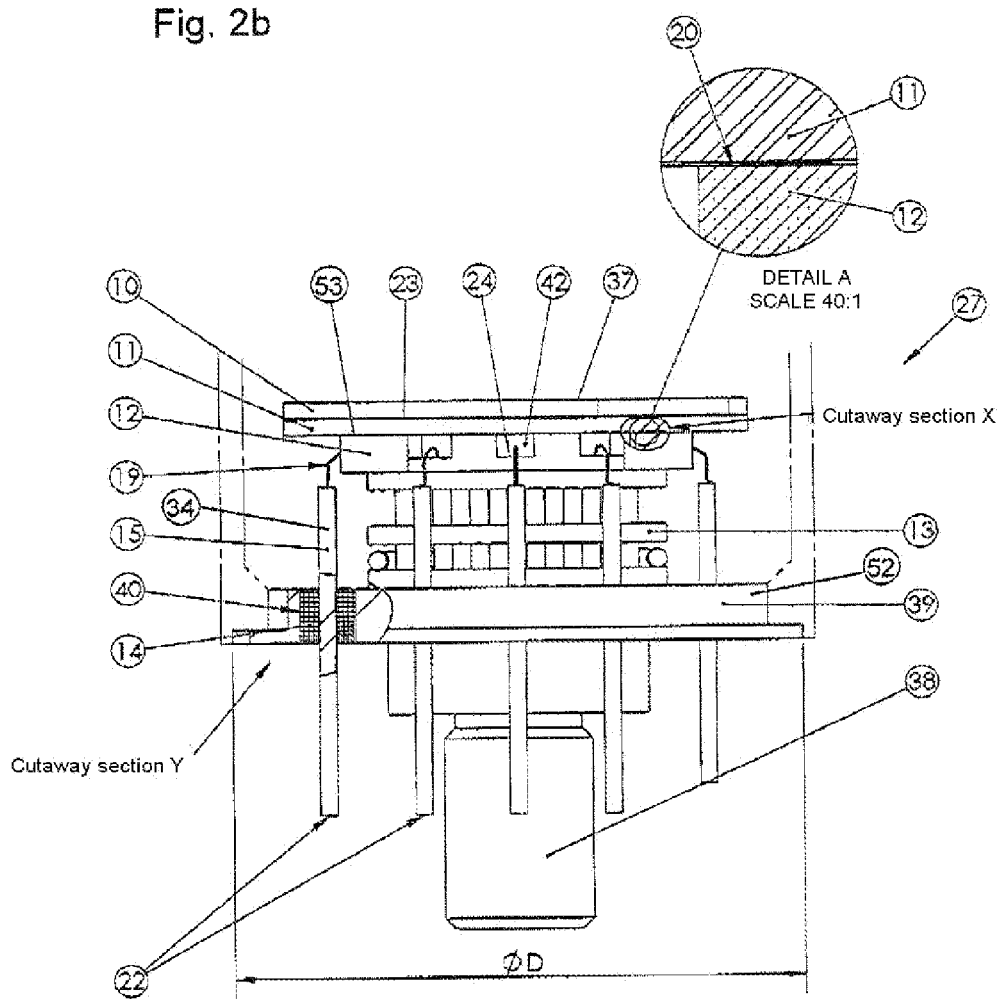

PRIOR ART

SECTION AB-AB
SCALE 5:1

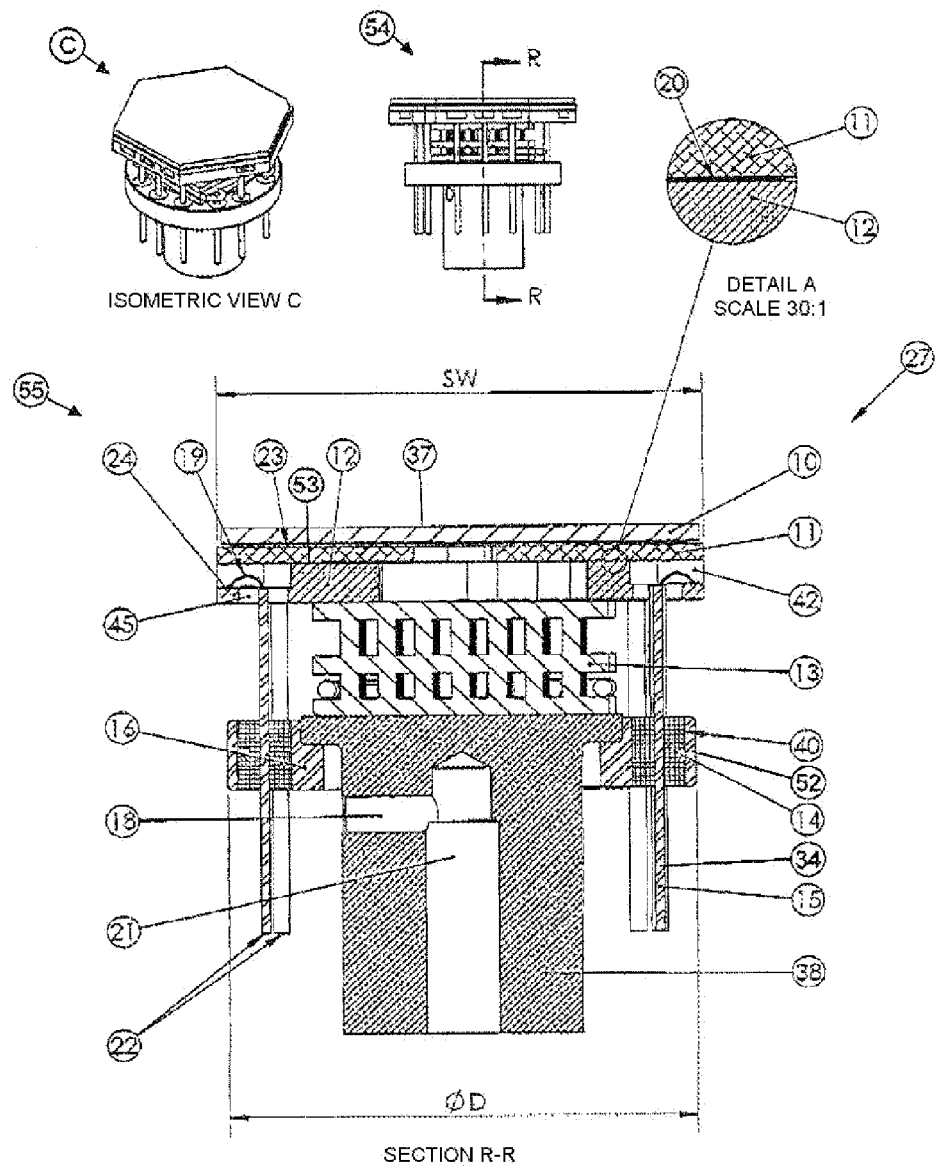

SECTION A-A

SENSOR HEAD FOR AN X-RAY DETECTOR, X-RAY DETECTOR WITH SENSOR HEAD AND SENSOR ARRANGEMENT

A sensor head for an X-ray detector is specified. Furthermore, an X-ray detector comprising a sensor head and a sensor arrangement comprising a plurality of sensor heads are specified. The X-ray detector can be used for example for electron beam microanalysis or X-ray fluorescence analysis.

X-ray detectors are known from the document DE 10 2005 037 860 A1.

In electron beam microanalysis, X-ray radiation which arises during the scanning of a sample by an electron beam in an electron microscope, for example a scanning electron microscope (SEM) or a transmission electron microscope (TEM), is detected and evaluated.

In X-ray fluorescence analysis (XFA), X-ray radiation which is generated during the irradiation of a sample with X-rays, in particular by an X-ray tube, is detected and evaluated.

Energy-dispersive X-ray detectors (EDX detectors) are often used, which are distinguished, inter alia, by the fact that they can detect a relatively large solid angle. The group of EDX detectors also includes the so-called silicon drift detectors (SDD detectors), which are usually produced from silicon wafers.

One object to be achieved of at least some embodiments is to specify a sensor head for an X-ray detector which has improved properties in comparison with known sensor heads. Further objects of at least some embodiments are to specify an X-ray detector comprising a sensor head and a sensor arrangement comprising a plurality of sensor heads.

These objects are achieved by means of the subjects described below. Advantageous embodiments and developments of the subjects are furthermore evident from the following description and the drawings.

A sensor head is specified, comprising a first conductor carrier having a frontal face. The first conductor carrier can comprise, for example, a body and conductors led in the body and serving for making contact with components. In accordance with one embodiment, the conductor carrier is embodied as a printed circuit board.

In accordance with a further embodiment, a sensor element is arranged on the first conductor carrier. The sensor element can be embodied, for example, as a sensor chip. Preferably, the sensor element is a sensor element sensitive to X-ray radiation. However, the sensor element can also serve for detecting any other radiation. The sensor element can be, for example, an Si(Li) detector, an HPGe detector, a PIN diode, a detector consisting of compound semiconductors, a silicon drift detector with external transistors or a silicon drift detector with an integrated FET. The sensor element is preferably a silicon drift detector.

In accordance with a further embodiment, the sensor element is arranged on the frontal face of the first conductor carrier. Preferably, the sensor element is electrically conductively connected to the conductors of the first conductor carrier.

In accordance with a further embodiment, the sensor element has a detection area. The detection area is provided for the radiation reception of a radiation to be detected by the sensor head and here and hereinafter can also be designated as sensor area. The sensor head is preferably suitable for detecting an X-ray radiation. Alternatively, however, the sensor head can also be suitable for detecting any other radiation.

By means of a sensor head described here, the detection area of a sensor head of an X-ray detector, in particular of an SDD detector, can be maximized whilst maintaining the overall size of the X-ray detector. As a result, what can advantageously be achieved, for example, is that the sensor head can be positioned as near as possible to a sample, for example in a spatially delimited region offset laterally with respect to the sample. As a result, the distance between the sample and the sensor head can be reduced and, at the same time, the solid angle of the radiation, and thus the quantity of radiation detected by the sensor head, can be increased.

Preferably, the sensor head comprises contact elements, which are electrically conductively connected to the sensor element via the conductors of the first conductor carrier. The contact elements can, for example, be embodied as continuing contact elements and serve for further contact-connection or external contact-connection of the sensor head.

In accordance with a further embodiment, the sensor head comprises bonding wires, which electrically conductively connect the first conductor carrier to the contact elements, such that the sensor element is electrically conductively connected to the contact elements. By way of example, the sensor head can comprise exactly one bonding wire for each contact element. Preferably, the bonding wires run on a side facing away from the frontal side of the first conductor carrier at least partly below the first conductor carrier.

In accordance with a further embodiment, the detection area at least partly covers the bonding wires in a plan view of the detection area. In other words, in a plan view of the detection area of the sensor element, the bonding wires are at least partly concealed by the detection area, wherein the plan view direction is preferably effected at a right angle with respect to the detection area. In accordance with a further embodiment, the detection area completely covers the bonding wires in a plan view of the detection area.

In accordance with a further embodiment, the contact elements are embodied as contact pins. The contact pins preferably comprise one or a plurality of electrically conductive materials. By way of example, the contact pins can be gold-plated. Preferably, in a plan view of the detection area, the contact elements span an area whose content is less than or equal to the area content of the detection area. Equally, in a plan view of the detection area, the contact pins can span an area whose content is less than or equal to the area content of the detection area. Furthermore, in a plan view of the detection area, the contact pins can span an area whose content is less than or equal to the area content of the frontal face of the first conductor carrier. Preferably, the area spanned by the contact pins is completely covered by the detection area in a plan view of the detection area. For insulation purposes, the contact pins can be at least partly enclosed by a tubular glass body. The glass body is preferably open at two ends in order to free the contact pins for contact-making.

In accordance with one embodiment, the ratio of the area content of the detection area to the area content of the area spanned by the contact pins is less than or equal to 1.5. In accordance with a further embodiment, the ratio of the area content of the detection area to the area content of the area spanned by the contact pins is greater than or equal to 1.0.

In accordance with one preferred embodiment, the ratio of the area content of the detection area to the area content of the area spanned by the contact pins lies in a range of between 1.0 and 1.5. In accordance with one particularly preferred embodiment, the ratio of the area content of the detection area to the area content of the area spanned by the contact pins lies in a range of between 1.2 and 1.35. It has been found that a sensor head in which the detection area of the sensor element has such a ratio with respect to the area spanned by the contact pins proves to be particularly advantageous. By way of example, it is possible to prevent the contact pins from protruding under the detection area in a plan view of the detection area. This can make it possible to arrange a plurality of sensor heads with respect to one another in such a way that the detection areas are arranged in direct proximity areally alongside one another.

In accordance with a further embodiment, the sensor head comprises a base body. The base body can comprise, for example, a base and a baseplate. The base serves for example for mechanically fixing the components of the sensor head. Preferably, the base comprises a material having a good thermal conductivity, for example copper. The baseplate can be arranged on the base, for example. The baseplate preferably has holes in which preferably the glass bodies accommodating the contact pins are arranged. Preferably, the length of the glass bodies corresponds to the thickness of the baseplate. The base body can also comprise further elements such as, for example, a thermoelectric cooler or signal and control connections.

In accordance with a further embodiment, the contact pins are connected to the base body and project from the base body, such that a free space is formed between the contact pins and the base body. In this case, the detection area preferably covers said free space. By way of example, the contact pins can be mounted on the base body and project from the latter in a direction of the first conductor carrier.

In a plan view of the detection area, which is preferably effected perpendicularly to the detection area, the base body can define an area which corresponds to the extent of the base body in a lateral direction, that is to say in a direction that is substantially parallel to the detection area. In accordance with one embodiment, the ratio of the area content of the detection area to the area defined by the base body of the sensor head is less than 1. In accordance with a further embodiment, the ratio of the area content of the detection area to the area defined by the base body is greater than 1.

In accordance with a further preferred embodiment, the ratio of the area content of the detection area to the area defined by the base body lies in a range of between 0.4 and 1.4. A ratio of the area content of the detection area to the area defined by the base body of the sensor head in a range of between 0.6 and 1.2 is particularly preferred. It has been found, for example, that a sensor head which has such a ratio of the area content of the detection area to the area defined by the base body is particularly well suited to being positioned as near as possible to a sample.

In accordance with a further embodiment, the sensor head comprises a second conductor carrier. The second conductor carrier is preferably arranged on that side of the first conductor carrier which faces away from the frontal face, and is electrically conductively connected to the first conductor carrier. Preferably, the second conductor carrier defines an area whose area content is less than the area content of the detection area. Furthermore, it is preferred for the second conductor carrier to be completely concealed by the detection area and/or by the first conductor carrier in a plan view of the detection area.

The first and/or the second conductor carrier can be embodied, for example, as a printed circuit board. The first and/or the second conductor carrier can comprise, for example, paper impregnated with phenolic resin or epoxy resin, glass-fiber fabric impregnated with epoxy resin, Teflon, polyester film or a ceramic. The conductors of at least one conductor carrier can, for example, comprise copper or be composed of copper. However, they can also comprise other materials. Preferably, the first and/or second conductor carrier comprise(s) a multilayer composite ceramic.

In accordance with a further embodiment, in a plan view of the detection area, the second conductor carrier is arranged within an area defined by the contact elements. By way of example, the second conductor carrier is arranged within the area spanned by the contact pins.

In accordance with a further embodiment, the second conductor carrier has, on the side facing the first conductor carrier, a frontal face smaller than the area spanned by the contact elements. Preferably, the contact elements embodied as contact pins are arranged on that side of the second conductor carrier which faces away from the frontal face in such a way that the longitudinal axes of the contact pins form a right angle with the frontal face of the second conductor carrier.

In accordance with a further embodiment, the bonding wires are directly connected to at least one portion of the contact elements. In accordance with a further embodiment, the bonding wires are directly connected to the second conductor carrier. By way of example, a plurality of contact-making locations can be arranged at the second conductor carrier, which contact-making locations can be embodied as bonding islands, for example, and at least one portion of which contact-making locations is electrically conductively connected to the contact elements via in each case at least one bonding wire.

Furthermore, the sensor head can comprise a plurality of signal and control connections. Preferably, the contact elements, in particular the contact pins, are used as signal and control connections.

A material which produces an electrical connection between the conductor carrier and the bonding wire is chosen as material for the contact-making locations. In this case, the contact-making locations are intended to remain positionally and dimensionally fixed in particular during the contact-making process. By way of example, adhesives containing metal powders or metals are suitable for this purpose. Preferably, the contact-making locations contain gold and/or aluminum.

In accordance with a further embodiment, the second conductor carrier has a projection. In this case, the contact-making locations on the second conductor carrier via which the second conductor carrier is electrically conductively connected to the contact elements by means of the bonding wires are preferably arranged on a side of the projection of the second conductor carrier which faces the first conductor carrier. By way of example, the projection is a marginal web which can run, for example, circumferentially around the second printed circuit board. In this case, in a plan view of the detection area, the contact elements are preferably arranged outside the second conductor carrier. Furthermore, it is preferred for the contact elements to terminate with the projection with their end facing the detection area or to be arranged below the projection in a plan view of the detection area.

In accordance with a further embodiment, the second conductor carrier has holes. Preferably, the contact elements at least partly project into the holes. By way of example, the second conductor carrier is configured such that the contact elements, in particular the contact pins, are arranged on that side of the first conductor carrier which faces away from the frontal face below the first conductor carrier and at least partly below the second conductor carrier and project into the holes introduced in the second conductor carrier, which holes are preferably arranged concentrically with the contact pins and are accessible from above. In particular, the holes introduced into the second conductor carrier can also be open toward the lateral edge of the second conductor carrier.

In accordance with a further embodiment, a cooling element is arranged at the second conductor carrier on a side facing away from the frontal face of the second conductor carrier, said cooling element preferably being embodied as a thermoelectric cooler. The thermoelectric cooler can comprise, for example, a plurality of Peltier elements. In accordance with a further embodiment, the second conductor carrier is part of the cooling element or of the thermoelectric cooler.

In accordance with a further embodiment, the second conductor carrier is electrically conductively connected to the first conductor carrier via a plurality of connecting contacts. By way of example, the first and the second conductor carrier can have a plurality of contact-making locations on the sides respectively facing one another, which contact-making locations are preferably opposite one another when the conductor carriers are placed one above another, and are embodied for example as bonding islands. The contact-making locations of the first conductor carrier can preferably be connected to the contact-making locations of the second conductor carrier by means of the connecting contacts. The number of contact-making locations for connecting contacts results from the number of signal and control connections required. By way of example, in accordance with one preferred embodiment, at least six of the contact-making locations for connecting contacts of the first conductor carrier are connected to contact-making locations for connecting contacts of the second conductor carrier.

The connecting contacts can be produced, for example, by means of bonding, for instance by means of thermal compression bonding or thermosonic bonding. The connecting contacts can also be produced by means of adhesive bonding, for instance using epoxy resin added to solder (epoxy encapsulated solder connection) or adhesive bonding using conductive or non-conductive adhesives and metal contacts (anisotropic conductive film/anisotropic conductive paste or non-conductive film/non-conductive paste). Furthermore, methods such as C4 (solder-to-solder), GGI (gold-to-gold), ESC (gold-to-solder/tin) and copper-pillar bonding can be applied.

Advantageous effects can be achieved by the arrangement described here of the contact-making locations, i.e. in particular of the contact-making locations for connecting contacts of the first and of the second conductor carrier for electrically conductively connecting the first and the second conductor carrier, and the arrangement of the contact-making locations of the second conductor carrier which are connected to the contact elements by means of the bonding wires. By way of example, it becomes possible, through the additional use of connecting contacts by comparison with the prior art, to greatly enlarge the sensor element, in particular the detection area of the sensor element, whilst maintaining the overall size of the sensor head.

Furthermore, the arrangement described here of the first conductor carrier, which is electrically conductively connected to the second conductor carrier via connecting contacts, makes it possible to dimension the sensor element such that all the control and signal lines and the connections thereof are positioned below the sensor chip in a plan view of the detection area, which advantageously in turn enables a maximization of the detection area whilst maintaining the overall size of the X-ray detector.

In accordance with a further embodiment, the frontal face of the first conductor carrier has an area content corresponding to the area content of the detection area. In accordance with a further embodiment, the frontal face of the first conductor carrier has a form corresponding to the form of the detection area. In this case, form can be taken to mean, in particular, the contour of the first conductor carrier and of the detection area, respectively, in a plan view of the detection area. By adapting the detection area with regard to its form and/or its area content to the first conductor carrier, what can advantageously be achieved is that the sensor element can be contact-connected well via the first conductor carrier.

In accordance with a further embodiment, the sensor head has a lateral extent that is less than 22 mm, and the detection area has an area content of between 190 $mm^2$ and 295 $mm^2$. In this case, lateral extent of the sensor head can denote the maximum lateral dimension of the sensor head, for example in a direction that is parallel to the detection area of the sensor element. In particular, in the case of a cylindrical sensor head, the diameter of the sensor head can be meant.

In accordance with a further embodiment, the sensor head has a lateral extent that is less than 18 mm, and the detection area has an area content of between 140 $mm^2$ and 210 $mm^2$.

In accordance with a further embodiment, the sensor head has a lateral extent that is less than 16 mm, and the detection area has an area content of between 40 $mm^2$ and 95 $mm^2$.

In accordance with a further embodiment, the detection area is embodied in circular fashion. A circular contour of the detection area, in particular also a circular contour of the sensor element and of the first conductor carrier, enables a maximum sensor chip area in the case of X-ray detectors which have a circular housing, for example a housing of the TO-8 design.

In accordance with a further embodiment, the detection area is embodied in hexagonal fashion. Preferably, the detection area in this case has six sides of equal length. This makes it possible to arrange sensor heads in a sensor arrangement areally in the form of a honeycomb pattern. In the case of a sensor arrangement of this type, the radiation detected by the sensor heads can be significantly increased.

In accordance with a further embodiment, the detection area is delimited by straight lines and circular line portions. In particular, the first conductor carrier and the sensor element arranged thereon can also have a contour having bent regions, for example circular or partly circular regions, and having flattened portions on at least one side. This makes it possible that the sensor element, for example in the EDX application, can be positioned nearer, and thus more optimally.

In accordance with a further embodiment, the sensor element is electrically conductively connected to the first conductor carrier using flip-chip technology. As a result, by way of example, the entire area of the sensor element can be utilized for contact-making.

In accordance with a further embodiment, the first conductor carrier and the second conductor carrier are electrically conductively connected to one another using flip-chip technology. In comparison with other technologies, this advantageously leads to shorter conductor lengths and, at the same time, time is saved when connecting the conductor carriers since all the contact-making locations can be connected simultaneously.

Furthermore, a sensor head for an X-ray detector is specified, comprising a first conductor carrier having a frontal face, and a sensor element having a detection area, which sensor element is sensitive to X-ray radiation, is arranged on the front face of the first conductor carrier and is electrically conductively connected to conductors of the first conductor carrier. Furthermore, the sensor head comprises a base body, which is arranged on the side facing away from the frontal face of the first conductor carrier.

In accordance with a further embodiment, the sensor head comprises a plurality of contact pins, which are electrically conductively connected to the sensor element via the first conductor carrier. Preferably, the contact pins project from the base body.

In accordance with a further embodiment, the contact pins span an area whose content is less than the area content of the detection area of the sensor element. The sensor head advantageously has a detection area maximized in relation to its lateral extent, for example the diameter of the base body. As a result, the sensor head can be positioned very near to a sample emitting a radiation and the quantity of radiation detected by the sensor element can be significantly increased.

The contact pins are preferably arranged below, i.e. on that side of the first conductor carrier which faces away from the frontal face of the first conductor carrier. In contrast to the prior art, where the contact pins are usually arranged laterally alongside the conductor carrier, this makes it possible to enlarge the detection area up to or beyond the spatial limits of a baseplate or perforated disk.

Furthermore, an X-ray detector is specified, in particular an EDX X-ray detector containing a sensor head described here. The X-ray detector can be used, in particular, for electron beam microanalysis and for X-ray fluorescence analysis.

Furthermore, a sensor arrangement is specified. The sensor arrangement comprises a plurality of sensor heads described here. In this case, the sensor elements of the individual sensor heads are preferably arranged areally alongside one another. The advantageous configuration of the sensor heads, wherein preferably all of the components of the sensor head which are arranged below the detection area in a plan view of the detection area are concealed by the detection area, makes it possible that the individual sensor heads within the sensor arrangement can be positioned areally close together in order to form large-area arrays having maximum utilization of the total area in the form of detection area and a minimum area not covered by the detection areas.

It is advantageous if the individual sensor heads are in each case at a distance of less than or equal to 2 mm, preferably less than or equal to 1 mm, from one another. In this case, the distance between the individual sensor elements is preferably equal to the distance between the individual sensor heads.

Further advantages and advantageous embodiments of the sensor head, X-ray detector and sensor arrangement described here will become apparent from the embodiments described below in conjunction with FIGS. 1a to 6b.

In the figures:

FIGS. 2b and 3b show a sensor head described here in a side view and in plan view;

Figure 4A:
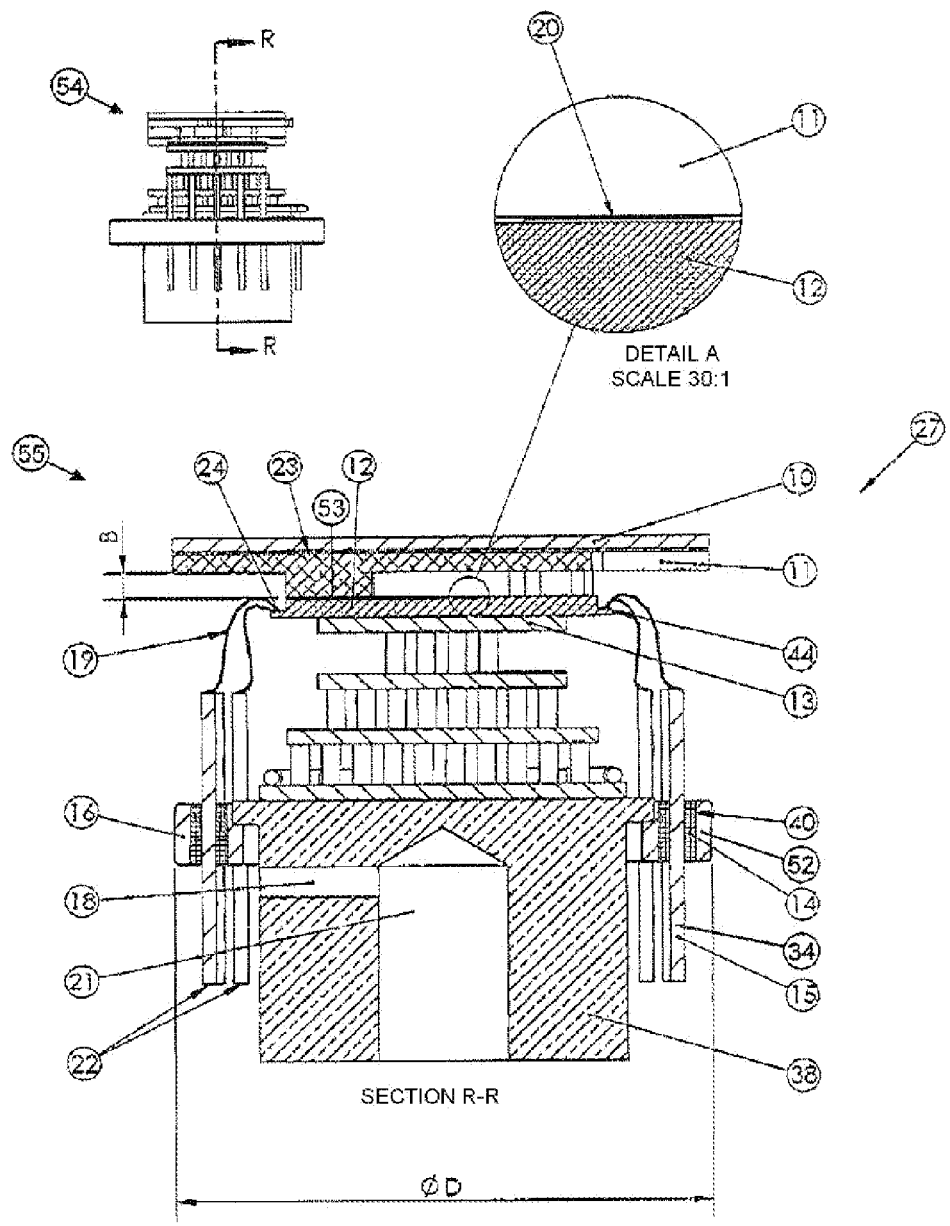
Figure 4B:
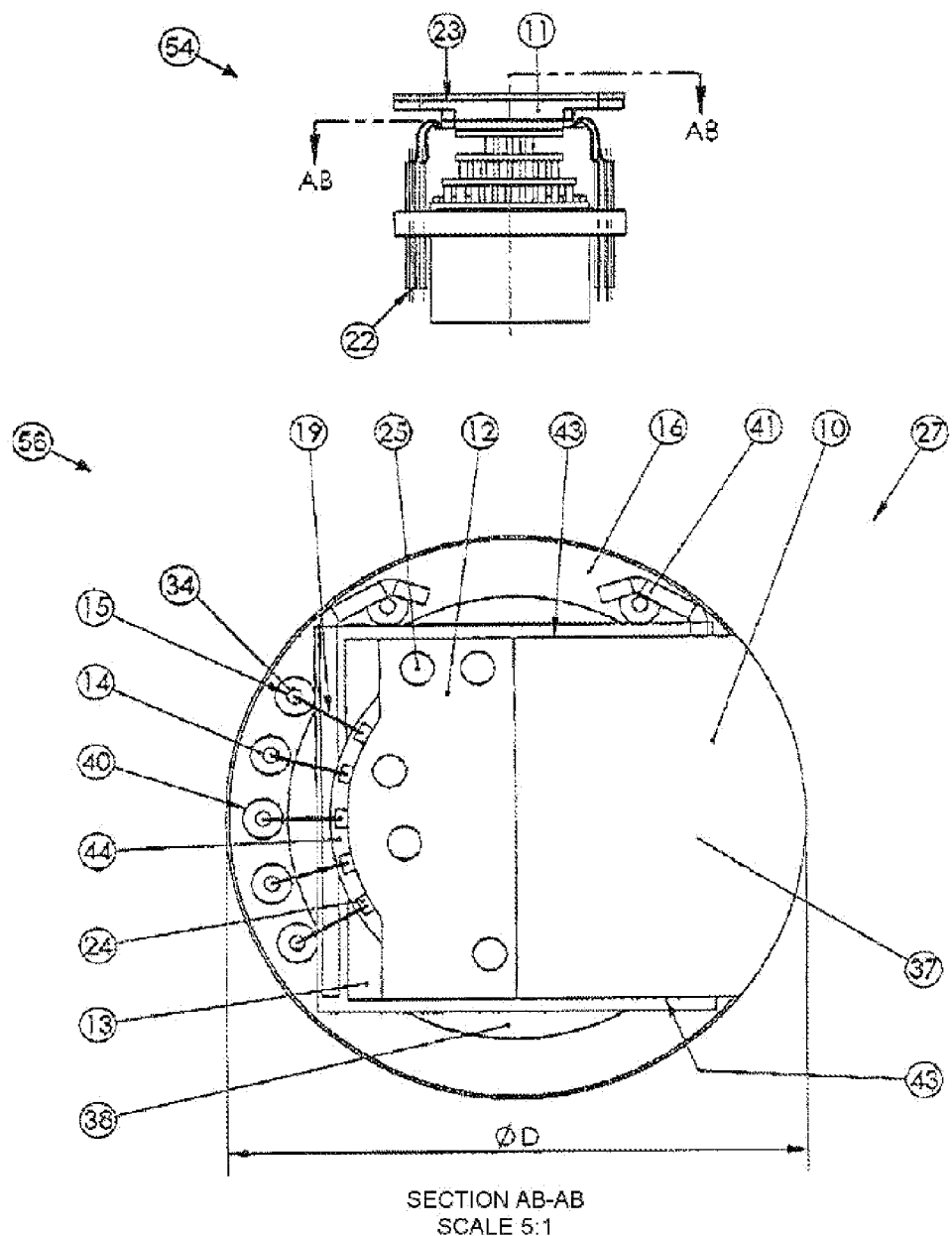
Figure 5B:
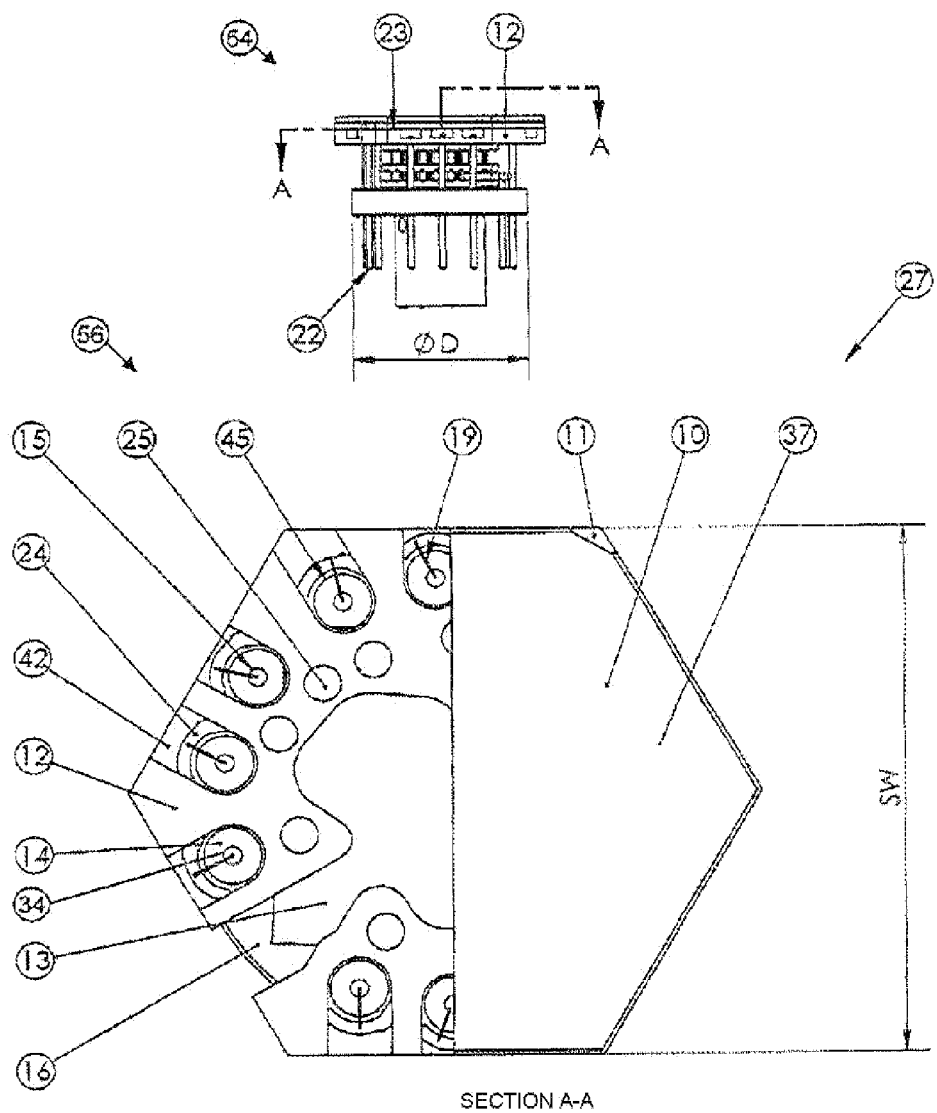
Figure 6A:
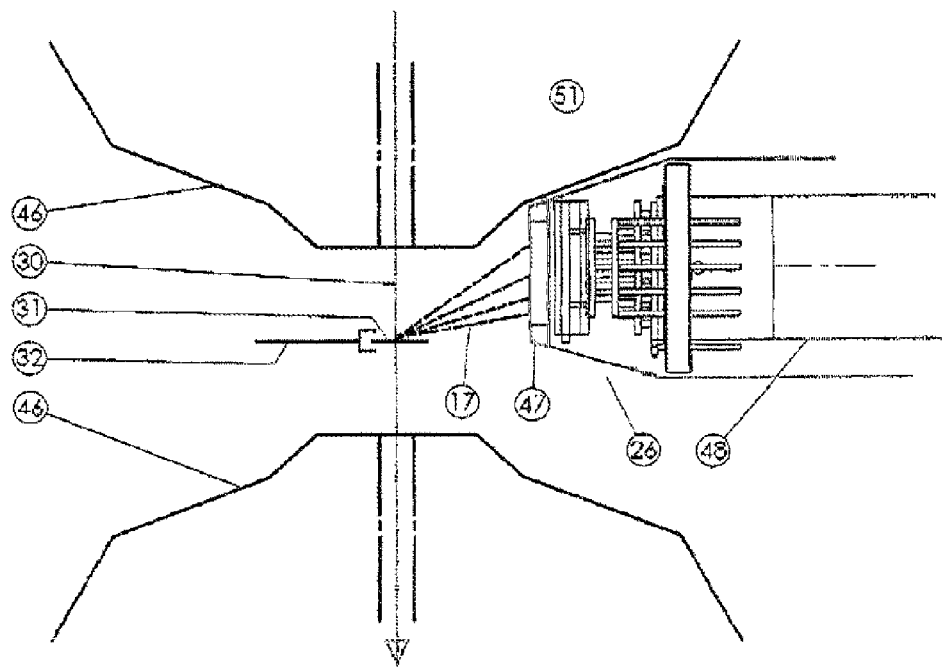
Figure 6B:
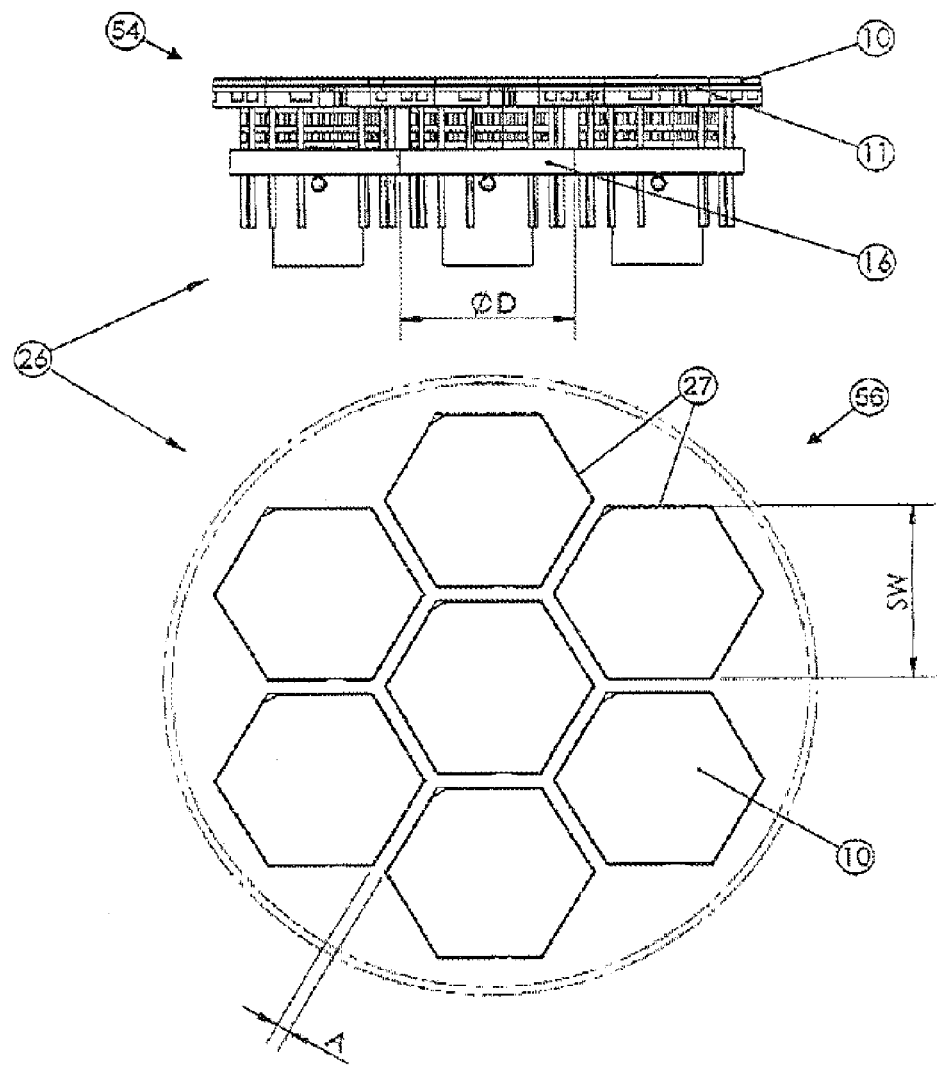

FIGS. 4a and 4b, and 5a and 5b, show further alternative configurations of the sensor head described here respectively in a side view and in a plan view; and FIGS. 6a and 6b show possibilities for application of sensor heads described here.

Figure 1A:
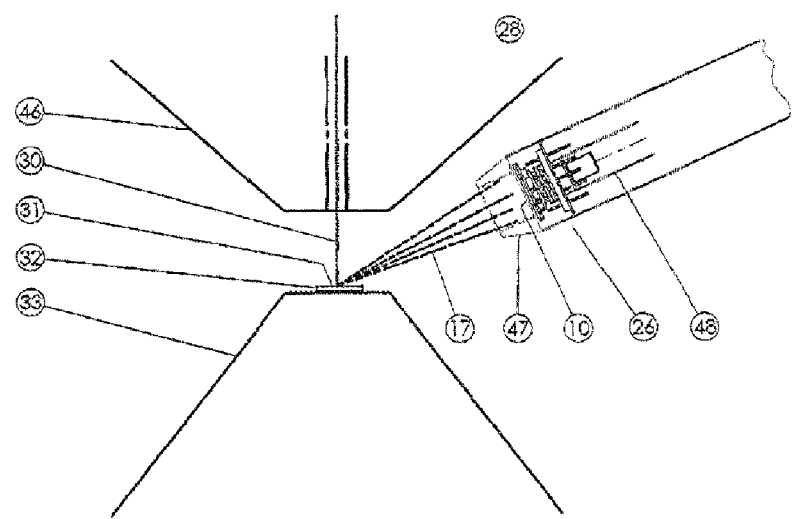
FIG. 1a shows a basic construction for electron beam microanalysis with a scanning electron microscope and an X-ray detector.

FIG. 1 illustrates an apparatus for electron beam microanalysis with an electron microscope 28 and an X-ray detector 26. The electron microscope comprises a pole shoe 46 and a sample stage 33 with a sample holder 32. An electron beam 30 emerges from the pole shoe 46, said electron beam exciting a sample 31 held by the sample holder 32. The X-ray radiation 17 emitted by the sample 31 can be detected by the X-ray detector 26. The X-ray detector 26 comprises a sensor element 10, a magnetic trap 47 for deflecting scattered electrons, and a cooling unit 48.

Figure 1B:
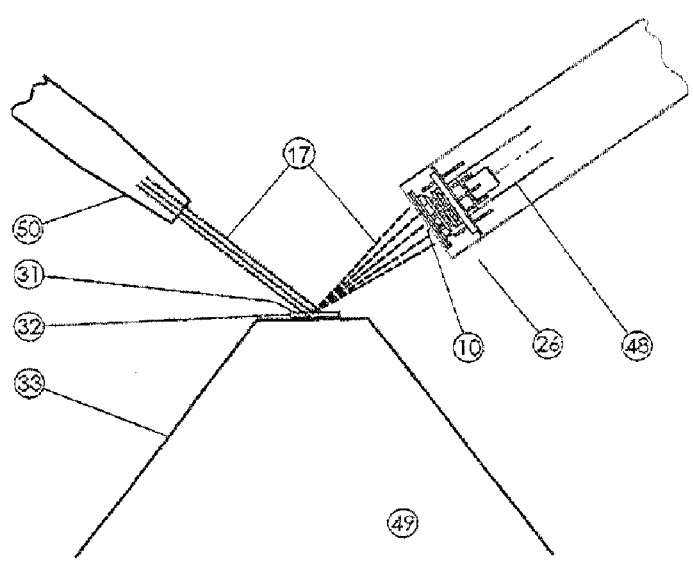
FIG. 1b shows a basic construction for X-ray fluorescence analysis with an X-ray tube and an X-ray detector.

FIG. 1b shows an apparatus for X-ray fluorescence analysis 49, which comprises an X-ray tube 50, from which X-ray radiation 17 emerges. The X-ray radiation 17 is directed onto a sample 31 held by a sample holder arranged on a sample stage 33. The sample 31 is excited by the X-ray radiation 17 and emits an X-ray radiation that can be detected by an X-ray detector 26.

Figure 2A:
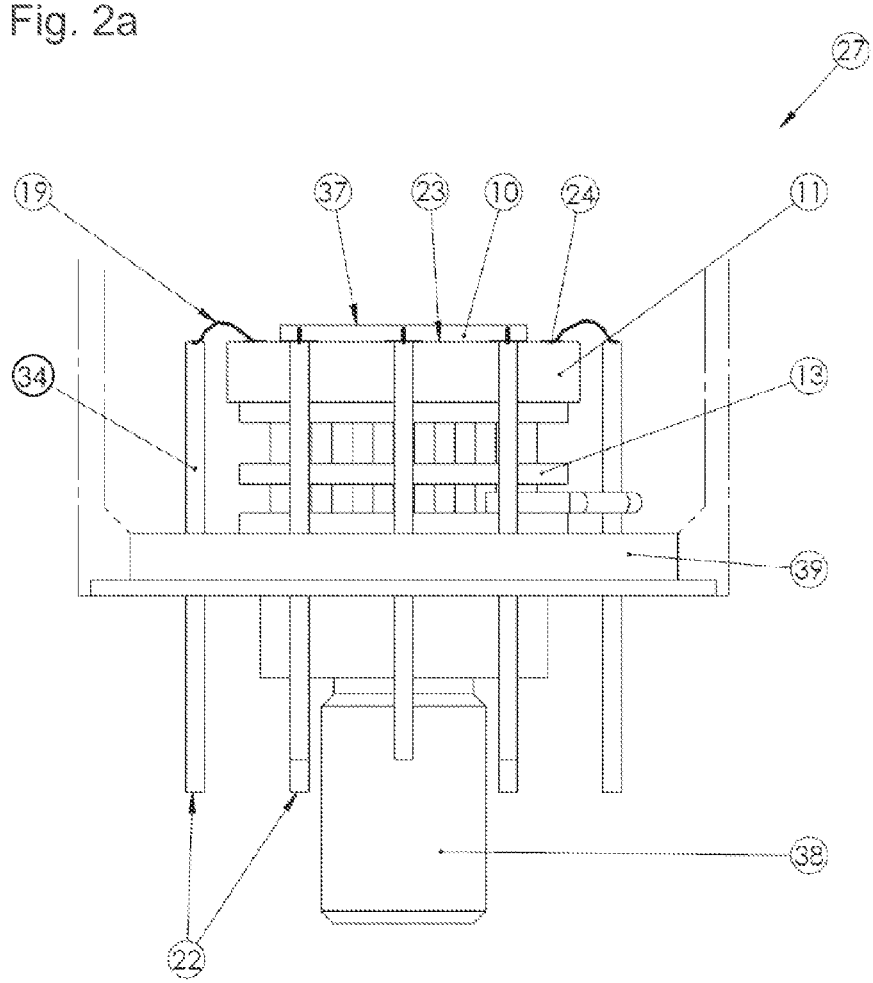
FIGS. 2a and 3a show a sensor head in accordance with the prior art in a side view and in plan view.

FIG. 2a shows a sensor head 27 for an X-ray detector 26 in accordance with the prior art in a side view. The sensor head 27 comprises a sensor chip 10 having a sensor area 37 smaller than a frontal face 23 of a printed circuit board 11. So-called bonding islands 24 are present on the frontal face 23 in regions not covered by the sensor chip 10. Furthermore, the sensor head 27 comprises a thermoelectric cooler 13, a base 38, a baseplate 39 and contact pins 34 fixed with the baseplate 39, said contact pins being electrically conductively connected to the bonding islands 24 via bonding wires 19. The contact pins 34 serve as signal and control connections 22.

FIG. 2b shows the sensor head 27 described here for an X-ray detector 26 in a side view. The sensor head 27 comprises a first conductor carrier 11 having a frontal face 23, and a sensor element 10 sensitive to X-ray radiation and having a detection area 37. The sensor element 10 is embodied as a sensor chip. It is mounted on the frontal face 23 of the first conductor carrier and electrically conductively connected to conductors of the first conductor carrier 11. The frontal face 23 of the first conductor carrier 11 has an area content corresponding to the area content of the detection area 37.

Furthermore, the sensor head 27 comprises contact elements 15, which are embodied as contact pins 34 and which are electrically conductively connected to the sensor element 10 via the first conductor carrier 11. Bonding wires 19 electrically conductively connect the first conductor carrier 11 to the contact elements 15, such that the sensor element 10 is electrically conductively connected to the contact elements 15.

In a plan view of the detection area 37, the detection area 37 of the sensor element 10 conceals the contact pins 34 and bonding wires 19 arranged below the first conductor carrier 11.

In contrast to the prior art, the first conductor carrier 11 and the sensor element 10 have a ring-shaped contour. The sensor element 10 and the first conductor carrier 11 have an identical diameter, which is less than the diameter D of a baseplate 39 of the sensor head 27.

Furthermore, the sensor head 27 comprises a second conductor carrier 12. In contrast to the prior art, unlike the usual situation, the first conductor carrier 11 is not arranged on the thermoelectric cooler 13, but rather on the second conductor carrier 12, which is mounted on the thermoelectric cooler 13 by the side facing away from the frontal face 23 of the first conductor carrier 11. In this case, the thermoelectric cooler 13 is preferably thermally conductively connected to the second conductor carrier 12. The second conductor carrier 12 has, on the side facing the first conductor carrier 11, a frontal face 53 having an area content that is less than the area content of the detection area 37 of the sensor element 10. The second conductor carrier 12 is configured in such a way that the contact pins 34 are arranged outside the second conductor carrier 12 alongside the latter and, consequently, are not concealed by the second conductor carrier in a plan view of the detection area 37.

Furthermore, the first conductor carrier 11 and the second conductor carrier 12 are electrically conductively connected to one another via connecting contacts 20, which can be, for example, metallic connecting contacts. For better illustration, the connection of the first and of the second conductor carrier 11, 12 is shown in a cutaway section X in the detail A.

The sensor element 10, the first conductor carrier 11, the second conductor carrier 12 and the thermoelectric cooler 13 are mounted for mechanical fixing on a base 38, which forms the center of the ring-shaped baseplate 39. The base 38 and the baseplate 39 are part of a base body 52 of the sensor head 27.

Cutaway section Y shows the baseplate 39, having holes 40 accommodating tubular glass bodies 14, in which the contact pins 34 are arranged. The contact pins 34 constitute the signal and control connections 22 required for the operation of the sensor element 10. Bonding wires 19 lead from the ends of the contact pins 34 in the form of a loop to contact-making locations 24 situated in cutouts 42 of the second conductor carrier 12, the bottom of which lies on the side facing the frontal face 23. The bonding wires 19 are electrically conductively connected firstly to the contact pins 34 and secondly to contact-making locations 24, which are arranged on the second conductor carrier 12 and can be embodied, for example, as so-called bonding islands. Preferably, at least six of the contact pins 34 as signal and control connections 22 are connected to the contact-making locations 24 of the second conductor carrier 12 by means of the bonding wires 19. The number of contact pins 34 connected to the contact-making locations 24 of the second conductor carrier 12 by means of the bonding wires 19 results from the number of signal and control connections required. At least two contact pins are preferably soldered to the thermoelectric cooler.

In the exemplary embodiment shown, the detection area 37 of the sensor element 10 is 65 mm$^2$ and is larger by a multiple in comparison with the prior art. The diameter D of the baseplate 39, which corresponds to the diameter of the sensor head 27 in the exemplary embodiment shown, is 15.3 mm.

It has been found that it is particularly advantageous if the area content of the detection area 37 of the sensor element 10 is greater than or equal to the area spanned by the contact pins.

Furthermore, it is advantageous if the sensor element is circumferentially at a lateral distance of at least 0.3 mm from a housing wall of the sensor head.

Figure 3A:
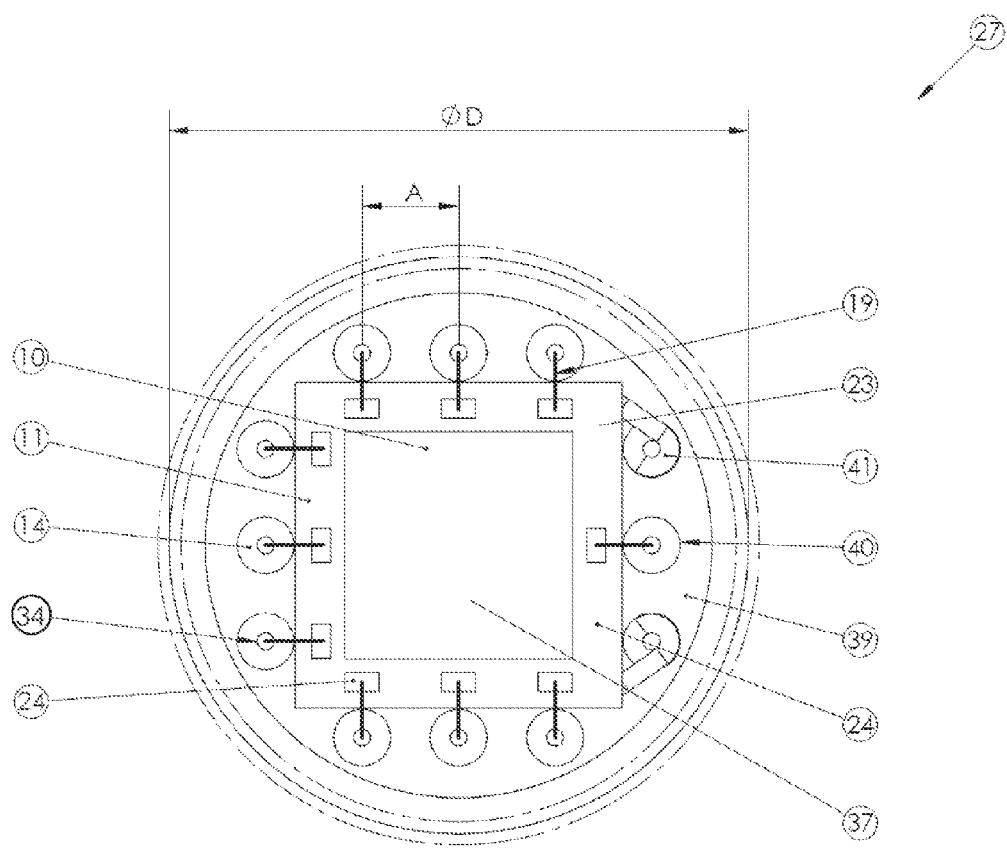

FIG. 3a illustrates a sensor head 27 in accordance with the prior art in plan view. The sensor head 27 comprises a sensor chip 10 and an underlying printed circuit board 11, wherein both the sensor chip 10 and the printed circuit board 11 have a square base area. In this case, the frontal face 23 of the printed circuit board 11 is larger than the sensor area 37 of the sensor chip. Bonding islands 24 are present on the frontal face 23 of the printed circuit board 11, wherein usually at least one bonding island 24 is respectively arranged opposite a contact pin 34. The bonding islands 24 are arranged at regular distances from one another. The contact pins 34 are arranged with glass bodies 14 in holes 40 of a baseplate 39, wherein the diameter of the baseplate 39 is greater than the diagonal of the frontal face 23 of the printed circuit board 11, such that the contact pins 34 are arranged outside the frontal face 23 of the printed circuit board 11. A diameter D of the sensor head 27 in accordance with the prior art is typically 15.3 mm given a sensor area 10 of 10 mm$^2$.

Figure 3B:
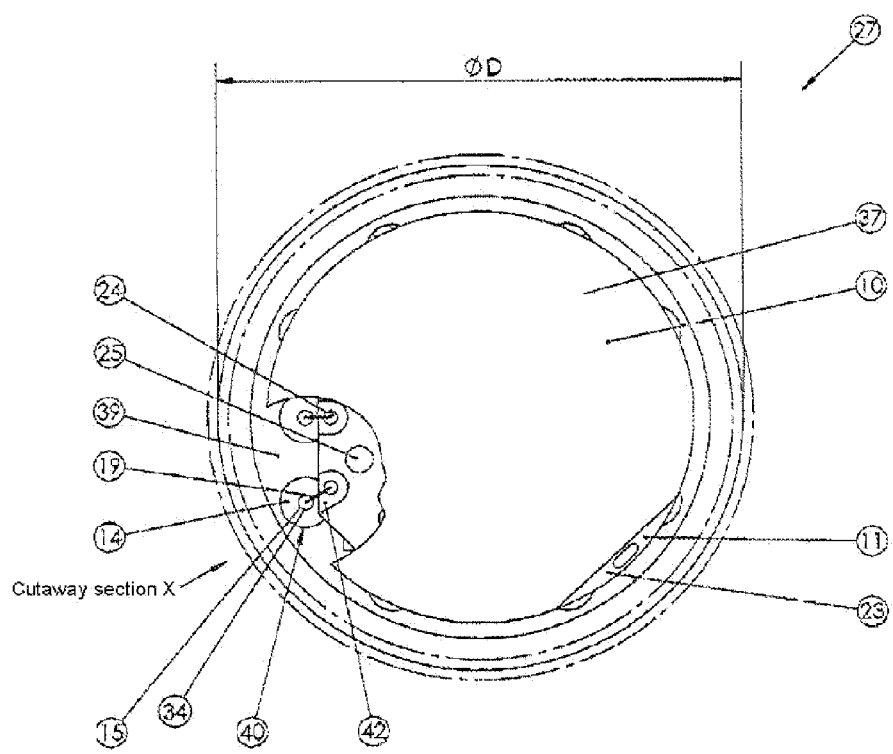

FIG. 3b shows the sensor head 27 from FIG. 2b in plan view. The components of the sensor head 27 are described from top to bottom. In contrast to the prior art, the sensor element 10 and the first conductor carrier 11 have a ring-shaped contour, wherein the sensor element 10 and the first conductor carrier 11 have an identical diameter, which is less than the diameter D of the baseplate 39 of the sensor head 27. The detection area 37 of the sensor element 10 is 65 mm$^2$ and is larger by a multiple in comparison with the prior art. The first conductor carrier 11 and the sensor element 10 mounted on the frontal face 23 conceal the contact pins 34 arranged underneath the plan view of the detection area 37.

The regions of the contact pins 34 and of the glass bodies 14 which are situated below the first conductor carrier 11 and are therefore not accessible to the observer in the plan view are shown as cutaway section X in a partial region in order to afford a better understanding. The cutaway section X shows the ends—facing the frontal face 23—of the contact pins 34, from which bonding wires 19 lead in the form of a loop to contact-making locations embodied as bonding islands. The bonding islands are situated in cutouts 42 of the second conductor carrier 12, the base of which lies on the side facing the frontal face 23 of the first conductor carrier 11. The bonding wires 19 are electrically conductively connected to the contact pins 34 and contact-making locations 24. The contact pins 34 constitute the signal and control connections 22 required for the operation of the sensor element 10.

The contact-making locations for connecting contacts 20, which can be, in particular, metallic connecting contacts, are arranged on that side of the second conductor carrier 12 which faces the frontal face 23, and are electrically conductively connected via connecting contacts 20 to contact-making locations for connecting contacts 25 of the first conductor carrier 11, which are arranged on the side facing away from the frontal face 23.

The baseplate 39 has the holes 40 accommodating the tubular glass bodies 14 with the contact pins 34 situated therein. The diameter D of the sensor head 27 is 15.3 mm.

FIG. 4a shows a sensor head 27 in accordance with a further exemplary embodiment, wherein a side view 54 of a sensor head 27 and a sectional view 55 of a section R-R through the sensor head 27 are shown.

The construction of the sensor head 27 corresponds, in principle, to the construction explained in connection with FIG. 2b. In contrast to the exemplary embodiment shown in FIG. 2b, the detection area 37 of the sensor element 10 and the frontal face 23 of the first conductor carrier 11 do not have ring-shaped areas, rather the detection area 37 and the frontal face 23 are delimited by straight lines and circular line portions. This can make it possible, in particular, that a plurality of sensor heads can be arranged areally alongside one another at a small distance.

The second conductor carrier 12, which is electrically conductively connected to the first conductor carrier 11 via connecting contacts 20, shown in detail A, has, in contrast to the exemplary embodiment shown in FIG. 2b, a protruding lateral projection 44, which can be embodied as a circumferential web and on whose side facing the frontal face 23 contact-making locations 24 are situated.

The sensor element 10, the first conductor carrier 11, the second conductor carrier 12 and the thermoelectric cooler 13 are mounted for mechanical fixing on the base 38, which forms the center of a ring-shaped perforated disk 16. For mounting purposes, the base 38 has a threaded hole 21 and at least one venting hole 18. The diameter D of the perforated disk 16 is equal to the diameter of the first conductor carrier 11 and of the sensor element 10 arranged on the frontal face 23 of the first conductor carrier 11.

Furthermore, analogously to the exemplary embodiment shown in FIG. 2b, the contact pins 34 are arranged below the first conductor carrier 11 and are completely concealed by the latter. The contact pins 34 are arranged in two mutually opposite semicircles, with the exception of two contact pins 34 which serve for making electrical contact with the thermoelectric cooler 13 and which are arranged in a manner 90° offset with respect to the mutually opposite semicircles, such that they are visible to an observer in the plan view.

From the ends of the contact pins 34 which are visible in the plan view, bonding wires 19 lead in the form of a long loop to contact-making locations 24 arranged on that side of the projection 44 of the second conductor carrier 12 which faces the frontal face 23 of the first conductor carrier 11. The thickness of the first conductor carrier 11 is reduced by the amount B in regions above the bonding wires 19.

Preferably, in the case of the exemplary embodiment in accordance with FIG. 4a the sensor element 10 has dimensions in a lateral direction which are less than or equal to the lateral dimensions of the base body 52 of the sensor head 27.

Furthermore, it has been found that it is particularly advantageous if the sensor element 10 has dimensions in a lateral direction which are greater than or equal to the area spanned by the contact pins 34.

FIG. 4b illustrates the exemplary embodiment of the sensor head 27 described in FIG. 4a in a side view 54 and in a plan view 56 of a section AB-AB, wherein, for better illustration, a section is taken through the center of the sensor head 27, in such a way that in the plan view on the left-hand side of the central axis the sensor element 10 and the underlying first conductor carrier 11 cannot be seen, rather the underlying second conductor carrier 12 can be seen. The components of the sensor head 27 are described from top to bottom.

The sensor element 10, the first conductor carrier 11, the second conductor carrier 12 and the thermoelectric cooler 13 are mounted for mechanical fixing on the base 38, which forms the center of the ring-shaped perforated disk 16. On the left-hand side of the illustration as seen from the central axis of the sensor head 27, it is possible to discern the second conductor carrier 12, the thermoelectric cooler 13, the bonding wires 19, the base 38 and the perforated disk having holes 40 accommodating the tubular glass bodies 14 with the contact pins 34 situated therein. In the right-hand side of the illustration as seen from the central axis of the sensor head 27, the sensor element 10 and the underlying thermoelectric cooler 13 with the connection 41, which is electrically conductively connected to a contact pin 34, are visible.

The contact-making locations shown on the left-hand side of the central axis of the sensor head 27, as seen from the central axis, for connecting contacts 25 situated on the second conductor carrier 12 on the side facing the frontal face 23 are electrically conductively connected via at least one connecting contact 20 in each case to the contact-making locations for connecting contacts 25 on the first conductor carrier 11 on the side facing away from the frontal face 23.

The sensor element 10 shown on the right-hand side of the central axis of the sensor head 27, as seen from the central axis, and the first conductor carrier 11, which is concealed in this view, have, by comparison with the exemplary embodiment shown in FIG. 2b, two flattened sides 43 running parallel to one another. The diameter D of the perforated disk 60 is equal to the diameter of the first conductor carrier 11, which is concealed in this view, and of the sensor element 10 arranged on the frontal face 23 of the first conductor carrier 11.

The contact pins 34 are once again arranged below the first conductor carrier 11. They can be discerned in FIG. 4b on the left-hand side, as seen from the central axis of the section. The contact pins 34 are arranged in two mutually opposite semicircles and are completely concealed by the first conductor carrier 11, with the exception of two contact pins 34 serving for making electrical contact with the thermoelectric cooler 13. This is because said contact pins are arranged in a manner 90° offset with respect to the mutually opposite semicircles and are therefore visible to the observer in the plan view of the detection area 37 of the sensor element 10. From the ends of the contact pins 34 which are visible in the plan view, bonding wires 19 lead in the form of a long loop to contact-making locations 24 arranged on that side of the marginal projection 44 of the second conductor carrier 12 which faces the frontal face 23.

FIG. 5a shows the sensor head 27 in accordance with a further exemplary embodiment, wherein an isometric view C of the sensor head 27, a side view 54 of the sensor head 27 and a sectional view 55 of a section R-R through the sensor head 27 are shown.

The construction of the sensor head 27 once again corresponds, in principle, to the construction explained in connection with FIG. 2b. The first conductor carrier 11 and the sensor element 10 mounted on the frontal face 23 thereof, and the second conductor carrier 12 have a hexagonal contour, in contrast to the exemplary embodiment shown in FIG. 2b. Preferably, in this case all six sides have an equal length. The conductor carrier 11 and the sensor element 10 mounted on the frontal face 23 conceal the contact pins 34 arranged underneath. The contact pins project into holes 45 of the second conductor carrier 12, wherein the holes 45 in the second conductor carrier 12 are arranged concentrically with respect to the contact pins 34. The first conductor carrier 11 and the second conductor carrier 12 are electrically conductively connected, as can be discerned in detail A, via a connecting contact 20, which is preferably a metallic connecting contact.

The sensor element 10, the first conductor carrier 11, the second conductor carrier 12 and the thermoelectric cooler 13 are mounted for mechanical fixing on the base 38, which forms the center of a ring-shaped perforated disk 16. The baseplate 39 has holes 40 accommodating the tubular glass bodies 14 with the contact pins 34 situated therein. The contact pins 34 serve for externally making contact with the sensor head 27 and constitute the signal and control connections 22 required for the operation of the sensor element 10. Bonding wires 19 lead from the ends of the contact pins 34 in the form of a loop to contact-making locations 24 situated in cutouts 42 of the second conductor carrier 12, the base of which lies on the side facing the frontal face 23. Furthermore, the bonding wires 19 are electrically conductively connected to the contact pins 34 and contact-making locations 24.

The hexagonal sensor element 10 and the hexagonal first conductor carrier 11 have a width across flats SW that defines the distance between two opposite parallel sides of the sensor element 10 and of the first conductor carrier 11, respectively. The width across flats SW of the hexagonal sensor element 10 and of the hexagonal first conductor carrier 11 is advantageously greater than the diameter D of the perforated disk 16 of the sensor head 27. The detection area 37 of the sensor element 10 has an area content of 115 mm$^2$ and is thus larger by a multiple in comparison with the prior art. The width across flats of the sensor element 10 and of the first conductor carrier 11 is 13 mm in the exemplary embodiment shown. Alternatively, smaller or larger widths across flats are also conceivable.

The sensor element 10 advantageously has a width across flats SW that is greater than or equal to the diameter of the base body 52 of the sensor head 27.

It is likewise advantageous if the sensor element 10 has a diameter that is less than or equal to twice the diameter of the base body 52 of the sensor head 27.

FIG. 5b shows the sensor head 27 from FIG. 5a in a side view 54 and in a plan view 56 of a section A-A, wherein, for better illustration, a section is taken through the center of the sensor head 27, in such a way that in the plan view on the left-hand side of the central axis the sensor element 10 and the underlying first conductor carrier 11 cannot be seen, rather the underlying second conductor carrier 12 can be seen.

The sensor element 10, the first conductor carrier 11, the second conductor carrier 12 and the thermoelectric cooler 13 are mounted for mechanical fixing on the base 38, which is concealed in the plan view and which forms the center of the ring-shaped perforated disk 16. On the left-hand side of the illustration as seen from the central axis of the sensor head 27, it is possible to discern the second conductor carrier 12 with the cutouts 42 situated at the edge, said cutouts having holes 45. The holes 45 are arranged concentrically with respect to the contact pins 34. Furthermore, the thermoelectric cooler 13, the bonding wires 19 and the perforated disk 16 can be discerned. The perforated disk 16 has holes accommodating the tubular glass bodies 14 with the contact pins 34 situated therein. Bonding wires 19 lead from the ends of the contact pins 34 in the form of a loop to contact-making locations 24 situated in cutouts 42 of the second conductor carrier 12, the base of which lies on the side facing the frontal face 23. The bonding wires 19 are electrically conductively connected to the contact pins 34 and contact-making locations 24.

Arranged on the second conductor carrier 12 there are contact-making locations for connecting contacts 25, which are electrically conductively connected via at least one preferably metallic connecting contact 20 in each case to the contact-making locations for connecting contacts 25 on the first conductor carrier 11 on the side facing away from the frontal face 23.

The width across flats SW of the hexagonal sensor element 10 and of the hexagonal conductor carrier 11 is greater than the diameter D of the perforated disk 16 of the sensor head 27.

FIG. 6a shows an advantageous possibility for application of a sensor head 27 for an X-ray detector 26 as described in connection with FIGS. 4a and 4b.

An apparatus for electron beam microanalysis is shown, which comprises a transmission electron microscope 51 having pole shoes 46, wherein an electron beam 30 emerges from the upper pole shoe 46. The electron beam 30 excites a sample 31 held in a sample holder 32. The X-ray radiation 17 emitted by the sample 31 is detected by an X-ray detector 26. In comparison with the prior art, by means of the configuration of the X-ray detector 26 described here, in particular by means of the above-described configurations of a sensor head 27, it is possible to position the X-ray detector 26 nearer toward the sample 31.

FIG. 6b shows in a side view 54 and in a plan view 56 a sensor arrangement comprising a multiplicity of sensor heads 27 as described in connection with FIGS. 5a and 5b. The sensor heads 27 each comprise a sensor element 10 having a hexagonal contour, wherein all six sides are of equal length. The sensor heads 27 in each case comprise a first conductor carrier 11 and a sensor element 10 mounted on the frontal face 23 of the first conductor carrier 11, wherein the width across flats SW of the first conductor carrier 11 and of the sensor element 10 is greater than the diameter D of the perforated disk 16. This geometrical configuration is therefore particularly well suited to creating sensor arrangements, so-called arrays, wherein the individual sensor heads 27 are arranged areally in a honeycomb pattern. In this case, the sensor heads 27 are preferably at a distance A from one another which is preferably less than 2 mm, less than 1 mm in an additionally preferred variant. By way of example, the individual sensor elements 10 are in each case at a distance of less than 2 mm or less than 1 mm from one another. Furthermore, preferably seven detectors are interconnected to form an array.

The invention is not restricted to the exemplary embodiments by the description on the basis of said exemplary embodiments, but rather encompasses any novel feature and also any combination of features. This includes, in particular, any combination of features in the patent claims, even if this feature or this combination itself is not explicitly specified in the patent claims or exemplary embodiments.

LIST OF REFERENCE NUMERALS

10 Sensor element
10 First conductor carrier
12 Second conductor carrier
13 Thermoelectric cooler
14 Glass body
15 Contact element
16 Perforated disk
17 X-ray radiation
18 Venting hole
19 Bonding wire
20 Connecting contact
21 Threaded hole
22 Signal and control connection
23 Frontal face of the first conductor carrier
24 Contact-making location
25 Contact-making location for connecting contacts
26 X-ray detector
27 Sensor head
28 Electron microscope (SEM)
30 Electron beam
31 Sample
32 Sample holder
33 Sample stage
34 Contact pin
35 Cooling device
37 Detection area
38 Base
39 Baseplate
40 Holes
41 Connections
42 Cutouts
43 Flattened sides
44 Projection
45 Hole
46 Pole shoe
47 Magnetic trap
48 Cooling unit
49 X-ray fluorescence analysis (XRF)
50 X-ray tube
51 Transmission electron microscope (TEM)
52 Base body
53 Frontal face of the second conductor carrier
D Diameter
SW Width across flats
C Isometric view
54 Side view
55 Sectional view
56 Plan view

The invention claimed is:

1. A sensor head for an X-ray detector, the sensor head comprising:
 a first conductor carrier having a frontal face;
 a sensor element that is sensitive to X-ray radiation arranged on the frontal face of the first conductor carrier, the sensor element being electrically conductively connected to conductors of the first conductor carrier and having a detection area;

contact elements electrically conductively connected to the sensor element via the conductors of the first conductor carrier, wherein the contact elements comprise contact pins, wherein the contact pins, in plan view of the detection area, span an area whose content is less than the area content of the detection area; and bonding wires that electrically conductively connect the first conductor carrier to the contact elements such that the sensor element is electrically conductively connected to the contact elements, wherein, in a plan view of the detection area, the detection area at least partly covers the bonding wires, wherein the bonding wires are directly connected to the contact pins.

2. The sensor head according to claim 1, wherein a ratio of the area content of the detection area to the area content of the area spanned by the contact pins lies in a range of between 1.2 and 1.35.

3. The sensor head according to claim 1, further comprising a base body that comprises a baseplate and a thermoelectric cooler, wherein the contact pins are connected to the baseplate and project from the baseplate such that a free space is formed between the contact pins and the thermoelectric cooler, wherein the detection area covers the free space.

4. The sensor head according to claim 3, wherein a ratio of the area content of the detection area to the area defined by the base body lies in a range of between 0.6 and 1.2.

5. The sensor head according to claim 1, further comprising a second conductor carrier arranged on that side of the first conductor carrier that faces away from the frontal face, the second conductor carrier being electrically conductively connected to the first conductor carrier, wherein the second conductor carrier defines an area whose area content is less than the area content of the detection area.

6. The sensor head according to claim 5, wherein the second conductor carrier, in the plan view of the detection area, is arranged within an area defined by the contact elements.

7. The sensor head according to claim 5, wherein the second conductor carrier has a frontal face smaller than the area spanned by the contact elements.

8. The sensor head according to claim 5, wherein the bonding wires are directly connected to the second conductor carrier.

9. The sensor head according to claim 5, wherein the second conductor carrier has a projection that has, on a side facing the first conductor carrier, contact-making locations, via which the second conductor carrier is electrically conductively connected to the contact elements by way of the bonding wires.

10. The sensor head according to claim 5, wherein the second conductor carrier has holes and wherein the contact elements at least partly project into the holes.

11. The sensor head according to claim 5, wherein the second conductor carrier is part of a thermoelectric cooler.

12. The sensor head according to claim 5, wherein the second conductor carrier is electrically conductively connected to the first conductor carrier via a plurality of connecting contacts that can be produced by bonding.

13. The sensor head according to claim 5, wherein the first conductor carrier and the second conductor carrier are electrically conductively connected to one another using flip-chip technology.

14. The sensor head according to claim 1, wherein the frontal face of the first conductor carrier corresponds to the detection area in terms of the area content and/or in terms of the form.

15. The sensor head according to claim 1, wherein the sensor head has a lateral extent that is less than 22 mm, and the detection area has an area content of between 190 mm$^2$ and 295 mm$^2$.

16. The sensor head according to claim 1, wherein the sensor head has a lateral extent that is less than 18 mm and the detection area has an area content of between 140 mm$^2$ and 210 mm$^2$.

17. The sensor head according to claim 1, wherein the sensor head has a lateral extent that is less than 16 mm, and the detection area has an area content of between 40 mm$^2$ and 95 mm$^2$.

18. The sensor head according to claim 1, wherein the detection area is embodied in a circular or hexagonal fashion or the detection area is delimited by straight lines and circular line portions.

19. The sensor head according to claim 1, wherein the sensor element is electrically conductively connected to the first conductor carrier using flip-chip technology.

20. A sensor arrangement comprising a plurality of sensor heads according to claim 1, wherein the sensor elements of the individual sensor heads are arranged areally alongside one another and wherein the sensor heads are at a distance of less than or equal to 1 mm from one another.

21. A sensor head for an X-ray detector, the sensor head comprising:
a first conductor carrier having a frontal face;
a sensor element that is sensitive to X-ray radiation arranged on the frontal face of the first conductor carrier, the sensor element being electrically conductively connected to conductors of the first conductor carrier and having a detection area;
a base body arranged on the side facing away from the frontal face of the first conductor carrier;
contact pins electrically conductively connected to the sensor element via the first conductor carrier and projecting from the base body, wherein the contact pins span an area whose content is less than the area content of the detection area; and
a second conductor carrier arranged on a side of the first conductor carrier that faces away from the frontal face, the second conductor carrier being electrically conductively connected to the first conductor carrier, wherein the second conductor carrier is arranged within an area spanned by the contact pins.

22. A sensor head for an X-ray detector, the sensor head comprising:
a first conductor carrier having a frontal face;
a sensor element that is sensitive to X-ray radiation arranged on the frontal face of the first conductor carrier, the sensor element being electrically conductively connected to conductors of the first conductor carrier and having a detection area;
contact elements electrically conductively connected to the sensor element via the conductors of the first conductor carrier, wherein the contact elements comprise contact pins, wherein the contact pins, in plan view of the detection area, span an area whose content is less than the area content of the detection area;
bonding wires that electrically conductively connect the first conductor carrier to the contact elements such that the sensor element is electrically conductively connected to the contact elements, wherein, in a plan view of the detection area, the detection area at least partly covers the bonding wires, wherein the bonding wires are directly connected to the contact pins; and a second conductor carrier arranged on a side of the first conductor carrier that faces away from the frontal face, wherein the second conductor carrier is electrically conductively connected to the first conductor carrier, wherein the second conductor carrier comprises contact-making locations on a side of the second conductor carrier that faces the first conductor carrier, wherein the second conductor carrier is directly electrically conductively connected with the contact pins by the bonding wires, wherein the contact-making locations are covered by the first conductor carrier, and wherein the second conductor carrier defines an area that is less than the detection area of the sensor element.

\* \* \* \* \*